(12) United States Patent
Bever et al.

(10) Patent No.: US 10,707,362 B2
(45) Date of Patent: *Jul. 7, 2020

(54) CONTROLLING OF PHOTO-GENERATED CHARGE CARRIERS

(71) Applicant: Infineon Technologies AG, Neubiberg (DE)

(72) Inventors: Thomas Bever, Munich (DE); Henning Feick, Dresden (DE); Dirk Offenberg, Dresden (DE); Stefano Parascandola, Dresden (DE); Ines Uhlig, Dresden (DE); Thoralf Kautzsch, Dresden (DE); Dirk Meinhold, Dresden (DE); Hanno Melzner, Sauerlach (DE)

(73) Assignee: Infineon Technologies AG, Neubiberg (DE)

(*) Notice: Subject to any disclaimer, the term of this patent is extended or adjusted under 35 U.S.C. 154(b) by 0 days.

This patent is subject to a terminal disclaimer.

(21) Appl. No.: 15/881,100

(22) Filed: Jan. 26, 2018

(65) Prior Publication Data

US 2018/0151765 A1   May 31, 2018

Related U.S. Application Data

(63) Continuation of application No. 14/093,172, filed on Nov. 29, 2013, now Pat. No. 9,905,715.

(Continued)

(51) Int. Cl.
*H01L 31/0352*   (2006.01)
*G01S 7/4914*   (2020.01)
*H01L 27/148*   (2006.01)

(52) U.S. Cl.
CPC .... *H01L 31/035272* (2013.01); *G01S 7/4914* (2013.01); *H01L 27/14806* (2013.01)

(58) Field of Classification Search
CPC ....... H01L 31/035272; H01L 27/14806; G01S 7/4914
See application file for complete search history.

(56) References Cited

U.S. PATENT DOCUMENTS 4,110,777 A * 8/1978 Esser .................. H01L 29/1062
257/220
4,142,200 A   2/1979 Mizushima et al.
(Continued)

FOREIGN PATENT DOCUMENTS

CN   101834202   9/2010
CN   101866976   10/2010
(Continued)

OTHER PUBLICATIONS

Wong et al., "Nanoscale CMOS," Invited Paper, Proceedings of the IEEE, vol. 87, No. 4, Apr. 1999, 34 pages.
(Continued)

*Primary Examiner* — Bitew A Dinke
(74) *Attorney, Agent, or Firm* — Harrity & Harrity, LLP

(57) ABSTRACT

Embodiments related to controlling of photo-generated charge carriers are described and depicted. At least one embodiment provides a semiconductor substrate comprising a photo-conversion region to convert light into photo-generated charge carriers; a region to accumulate the photo-generated charge carriers; a control electrode structure including a plurality of control electrodes to generate a potential distribution such that the photo-generated carriers are guided towards the region to accumulate the photo-generated charge carriers based on signals applied to the control electrode structure; a non-uniform doping profile in the semiconductor substrate to generate an electric field with vertical field vector components in at least a part of the photo-conversion region.

20 Claims, 8 Drawing Sheets

Related U.S. Application Data

(60) Provisional application No. 61/731,373, filed on Nov. 29, 2012.

(56) References Cited

U.S. PATENT DOCUMENTS

| | | | | |
|---|---|---|---|---|
| 4,160,985 | A * | 7/1979 | Kamins | H01L 31/103 257/443 |
| 4,198,646 | A * | 4/1980 | Alexander | H01L 27/14875 250/338.4 |
| 4,242,695 | A | 12/1980 | Mukai et al. | |
| 4,258,376 | A * | 3/1981 | Shannon | H01L 29/76858 250/338.4 |
| 4,271,419 | A * | 6/1981 | Hornbeck | H01L 27/14868 257/216 |
| 4,321,614 | A * | 3/1982 | Bluzer | H01L 27/14856 257/227 |
| 4,616,247 | A | 10/1986 | Chang et al. | |
| 5,160,996 | A | 11/1992 | Odanaka | |
| 5,359,221 | A | 10/1994 | Miyamoto et al. | |
| 5,430,321 | A | 7/1995 | Effelsberg | |
| 5,569,941 | A * | 10/1996 | Takahashi | H01L 29/0834 257/132 |
| 5,618,688 | A * | 4/1997 | Reuss | H01L 21/8249 257/370 |
| 5,747,840 | A | 5/1998 | Merrill | |
| 5,814,866 | A * | 9/1998 | Borland | H01L 21/761 257/350 |
| 5,859,462 | A | 1/1999 | Tredwell et al. | |
| 5,898,196 | A | 4/1999 | Hook et al. | |
| 5,929,478 | A * | 7/1999 | Parris | H01L 27/115 257/314 |
| 5,994,162 | A * | 11/1999 | Burghartz | H01L 31/18 257/E31.069 |
| 6,091,108 | A * | 7/2000 | Harris | H01L 29/0623 257/339 |
| 6,096,951 | A | 8/2000 | Weber | |
| 6,114,737 | A | 9/2000 | Tonai | |
| 6,392,282 | B1 | 5/2002 | Sahara et al. | |
| 6,445,014 | B1 | 9/2002 | Rhodes et al. | |
| 6,483,129 | B2 | 11/2002 | Rhodes et al. | |
| 6,555,890 | B2 | 4/2003 | Dries et al. | |
| 6,649,948 | B2 | 11/2003 | Inoue | |
| 6,683,360 | B1 * | 1/2004 | Dierickx | H01L 27/14658 257/428 |
| 6,806,152 | B1 | 10/2004 | Klein | |
| 9,494,688 | B2 | 11/2016 | Mase et al. | |
| 9,905,715 | B2 * | 2/2018 | Bever | H01L 31/035272 |
| 10,008,621 | B2 | 6/2018 | Bever et al. | |
| 2001/0006237 | A1 | 7/2001 | Abe et al. | |
| 2002/0096715 | A1 * | 7/2002 | Sumida | H01L 29/0634 257/342 |
| 2003/0042488 | A1 | 3/2003 | Rhodes | |
| 2005/0247941 | A1 | 11/2005 | Adachi | |
| 2005/0280076 | A1 * | 12/2005 | Barthelmess | H01L 21/263 257/327 |
| 2006/0086955 | A1 | 4/2006 | Iwata | |
| 2008/0001159 | A1 * | 1/2008 | Ota | H01L 29/0623 257/77 |
| 2008/0135896 | A1 * | 6/2008 | Fan | H01L 27/14603 257/292 |
| 2008/0191123 | A1 | 8/2008 | Lutz et al. | |
| 2008/0217723 | A1 * | 9/2008 | Lauxtermann | H01L 27/14603 257/460 |
| 2008/0247033 | A1 | 10/2008 | Buettgen | |
| 2009/0184384 | A1 | 7/2009 | Sanfilippo et al. | |
| 2010/0019294 | A1 * | 1/2010 | Velichko | H01L 27/1463 257/292 |
| 2010/0271108 | A1 * | 10/2010 | Sanfilippo | H01L 31/107 327/502 |
| 2011/0085067 | A1 | 4/2011 | Venizia et al. | |
| 2011/0089471 | A1 * | 4/2011 | Buettgen | H01L 27/14806 257/222 |
| 2011/0291164 | A1 * | 12/2011 | Bamji | G01S 7/4816 257/290 |
| 2013/0120735 | A1 * | 5/2013 | Mase | G01S 7/4863 356/4.01 |
| 2013/0200477 | A1 * | 8/2013 | Sun | H01L 31/022408 257/431 |
| 2014/0145281 | A1 | 5/2014 | Bever et al. | |

FOREIGN PATENT DOCUMENTS

| | | |
|---|---|---|
| CN | 102280502 | 12/2011 |
| JP | 2012-083215 A | 4/2012 |
| WO | WO 2011/157726 | 12/2011 |
| WO | WO 2012/049885 | 4/2012 |

OTHER PUBLICATIONS

Fossum et al., "Future Prospects for CMOS Active Pixel Sensors," 1995 IEEE Workshop on CCDs and Advanced Image Sensors, Apr. 21, 1995, 20 pages.

* cited by examiner

CONTROLLING OF PHOTO-GENERATED CHARGE CARRIERS

RELATED APPLICATIONS

This application is a continuation of U.S. patent application Ser. No. 14/093,172, filed on Nov. 29, 2013, which claims priority under 35 U.S.C. § 119 to U.S. Provisional Patent Application No. 61/731,373, filed on Nov. 29, 2012, the contents of which are incorporated by reference herein in their entirety.

BACKGROUND

Photo-sensitive devices such as imager devices are used in many applications and variations. In addition to solid state imagers like CCD (charge coupled devices) imagers or CMOS (Complementary Metal Oxide Semiconductor) imagers which are capable of providing 2D (2 dimensional) images, 3D imager or depth imagers are becoming increasingly popular for multiple applications. For 3D imaging and depth imaging, optical sensors based on time-of-flight (TOF) are very promising for future applications ranging from the taking of a profile of objects or environments, the tracking and recognition of objects and human beings to the recognition of movements of certain parts or gesture recognition.

In applications of TOF sensors as well as for other optical imagers, the transfer of charge is crucial to the operation of the imager. To give one example, for the demodulation of incoming light provided by devices which are based on the time-of-flight principle the timely transfer of charge carriers to the read-out nodes is critical for the accuracy of the depth information as well as other operation parameters.

SUMMARY

According to one aspect, a method of manufacturing a device comprises providing a non-uniform doping profile such that an electric field with vertical field vector components is generated in at least a part of a photo-conversion region and generating a control electrode structure including a plurality of control electrodes above the non-uniform doping profile for directing photo-generated charge carriers.

According to a further aspect, a device includes a semiconductor substrate comprising a photo-conversion region to convert light into photo-generated charge carriers, a region to accumulate the photo-generated charge carriers and a control electrode structure including a plurality of control electrodes to generate a potential distribution such that the photo-generated carriers are guided towards the region to accumulate the photo-generated charge carriers based on signals applied to the control electrode structure. A non-uniform doping profile is provided in the semiconductor substrate to generate an electric field with vertical field vector components in at least a part of the photo-conversion region.

According to a further aspect a device includes a substrate with a first main surface and a second main surface, the substrate comprising a photo-conversion region to convert incoming light into photo-generated charge carriers. The device is configured to receive the incoming light at the second main surface. At least one region is provided to accumulate the photo-generated charge carriers located at the first main surface. A control electrode structure is arranged at the first main surface to generate a potential distribution in the semiconductor substrate such that the photo-generated carriers are guided towards the at least one region to accumulate the photo-generated charge carriers based on signals applied to the control electrode structure. A semiconductor doping profile to generate an electric field with vertical field vector components in at least a part of the photo-conversion region.

DETAILED DESCRIPTION

Figure 1A:
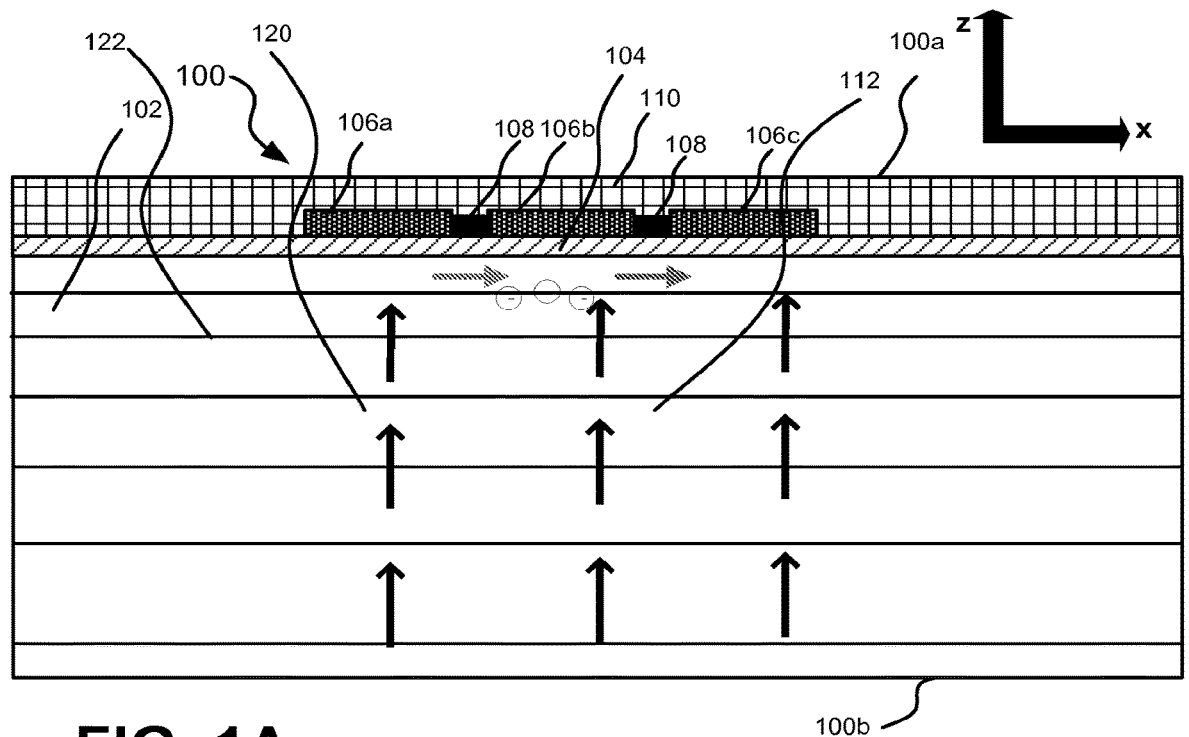
FIG. 1A shows a device according to an embodiment.

The following detailed description explains exemplary embodiments. The description is not to be taken in a limiting sense, but is made only for the purpose of illustrating the general principles of embodiments while the scope of protection is only determined by the appended claims.

In the exemplary embodiments shown in the drawings and described below, any direct connection or coupling between functional blocks, devices, components or other physical or functional units shown in the drawings or described herein can also be implemented by an indirect connection or coupling. Functional blocks may be implemented in hardware, firmware, software, or a combination thereof.

Further, it is to be understood that the features of the various exemplary embodiments described herein may be combined with each other, unless specifically noted otherwise.

In the various figures, identical or similar entities, modules, devices etc. may have assigned the same reference number.

The term vertical is used in a non-limiting way to describe in embodiments directions vertical or substantially vertical to a surface of a substrate such as a main surface of the substrate. The term lateral is used in a non-limiting way to describe in embodiments directions parallel or substantially parallel to a surface of a substrate such as a main surface of the substrate.

The term substrate used in embodiments may include but is not limited to semiconductor substrates such as a semiconductor die, a stacked die, a semiconductor die with one or more additional semiconductor layers such as epi-layers, poly-silicon layers etc.

FIG. 1 shows an embodiment of a device 100 which includes a substrate 102 having a photo-conversion region 112. The device is configured such that light penetrates into the photo-conversion region 112 and at least a part of the incoming light is converted into charge carriers of both types, i.e. electrons and holes. In some embodiments, the light might be introduced to the photo-conversion region from a front side 100a of the device 100. In other embodiments, the light might be introduced to the photo-conversion region from the back side 100b of device 100. The photo-conversion region may in embodiments extend in vertical direction between 15 μm and 60 μm into the substrate with each value in this range and each sub-range constituting a specific embodiment.

The device 100 further includes a layer 104 of insulating material above which a first control electrode 106a, a second control electrode 106b and a third control electrode 106c are provided. Layer 104 is typically provided as thin layer, e.g. a gate layer, and may for example include silicon oxide. The elements shown in FIG. 1A may form a single pixel of plurality of pixels. Thus, the control electrodes may form in some embodiments the modulation gates of a demodulation structure within a pixel of a continuous wave time-of-flight imager. It is therefore to be noted that in some embodiments multiple pixels are formed within the device resulting in a repetition of the structures and elements shown in FIG. 1A for a single pixel.

Structures 108 are formed between the control electrodes 106a, 106b, 106c. The structures 108 may include for example spacers or liners generated in the manufacturing process for electric isolation of the control electrodes 106a, 106b, 106c. Other structures not shown in FIG. 1A such as metal layers and vias may be further included in the device 100.

Furthermore, a cover layer 110 extending above the semiconductor substrate 102 is provided. As can be seen from FIG. 1A, the cover layer 110 covers the control electrodes 106a, 106b, 106c and the structures 108 provided in the device 100. In some embodiments, additional elements such as shielding elements for shielding light-sensitive areas such as read-out nodes may be provided in or above the cover layer 110

In the embodiment of FIG. 1A, the second control electrode 106b is arranged between the first control electrode 106a and the third control electrode 106c with respect to a lateral direction (x-direction). In some embodiments, the second control electrode has a lateral distance to at least one of the first or second control electrode between 50 nm and 1 μm, where each value within this range and each sub-range constitutes one embodiment. In some embodiments, the third control electrode has a lateral distance to at least one of the first or second control electrode between 0.1 μm and 0.5 μm. In some embodiments, the second control electrode has a lateral distance to both of the first or third control electrode between 50 nm and 1 μm, where each value within this range and each sub-range constitutes one embodiment. In some embodiments, the second control electrode has a lateral distance to both of the first or third control electrode between 0.1 μm and 0.5 μm.

In embodiments, the control electrodes 106a, 106b and 106c are manufactured such that the control electrodes are transparent or at least semi-transparent to the incoming light generating the charge carriers in the photo-conversion region 112. This may be provided by having a respective thin layer for the electrodes and/or using material which is transparent or semi-transparent for the incoming light. In some embodiments, the light of operation may be infrared light or near-infrared light. In some embodiments, the light of operation may be visible light. As will be described later on with respect to FIG. 8, the light of operation may be modulated when emitted from a light source by a modulation signal. When used within a demodulation pixel, the control electrodes are then provided with a signal having a same frequency but a predefined time delay with respect to the light modulation signal.

In embodiments, the control electrodes 106a, 106b, 106c are electrodes to direct the photo-generated charge carriers in a lateral direction based on the potentials present at the respective control electrodes 106a, 106b, 106c. In embodiments, the potentials at the control electrodes 106a, 106b, 106c causes the generating of space charge regions in semiconductor regions below the respective control electrode. As will be described further below, the device 100 is capable to generate space charge regions of different extensions below the respective control electrodes 106a, 106b, 106c based on the respective electric potential present at the control electrode. Below a respective control electrode, the extension of the space charge region and therefore the electric potential is approximately constant while in the region between two adjacent control electrodes with different space charge extensions electric drift fields are generated. As a result a potential distribution for photo-generated charge carriers is generated in the semiconductor region near the substrate surface causing drift fields in a lateral direction depending on the electric potentials present at the control electrodes 106a, 106b, 106c.

In one embodiment, the electric potential of at least one of the control electrodes may be mainly generated by a capacitive coupling to other control electrodes. This has the advantage of reduced current consumption as the at least one control electrode is not actively driven but only by way of a capacitive divider. By supplying potentials to the control electrodes surrounding the at least one control electrode, a charge redistribution at the control electrode 106c is initiated which causes the potential of the at least one control electrode in operation to be between the currently present potentials of the adjacent control electrodes. With at least one of the actively driven control electrodes being driven with varying electric potential, continuous charge redistribution is effected in the at least one control electrode. Distinguished from the other control electrodes which have their potentials supplied by fixed potential sources or time-varying potential sources, the potential of the control electrode is driven by capacitive coupling to the other control electrodes allowing to reduce the current consumption for driving the control electrodes.

Figure 1B:
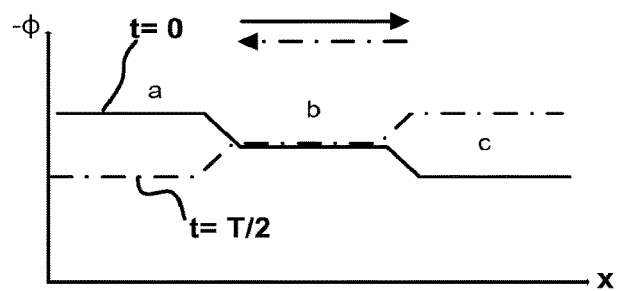
FIG. 1B shows example potential distributions for the device of FIG. 1A.

FIG. 1B shows a diagram resulting from an example operation of the control electrodes 106a, 106b and 106c of FIG. 1A according to an embodiment. FIG. 1B shows as abscissa the electric potential distribution as negative electric potential caused by the control electrodes 106a, 106b, and 106c in the semiconductor regions below the control gates. The negative electric potential corresponds to the potential energy seen by photo-generated electrons (negative charges) which are in the described embodiments the charge carriers to be transferred by the control electrodes 106a, 106b, 106c.

As can be seen, the potential applied to the first control electrode 106a (indicated in FIG. 1B by "a") varies such that a maximum of the potential energy is obtained at time t=0 and a minimum is obtained at time t=T/2. The second control electrode 106b (indicated in FIG. 1B by "b") is kept constant. It can be seen at both times t=0 and t=T/2, the potential distribution is a step-wise such that for the control electrode 106b arranged between the control electrodes 106a and 106c the potential of the control electrode 106b is also between the potential of the control electrodes 106a, 106c. The use of two control electrodes driven by time-varying signals while one control electrodes is maintained on a constant electric potential provides the required step-wise potential distribution in a very power-efficient manner since no time-varying driving signal has to be applied to the control electrode 106b.

It is to be noted that the number of steps in the potential distribution generated by the control electrode configuration can be increased by adding additional control electrodes. If the number of control electrodes is K, the number of steps in the potential distribution adds up to K+1.

In the operation described above, the generated charge carriers may be guided by the electric field generated by the control electrodes to read out nodes which are arranged lateral to the control electrode structure. In other words, the control electrode arrangement is capable to provide a bidirectional transfer to each lateral side once the charge carriers reach the influence zone of the control electrodes. In optical time-of-flight sensors the controlling of the charge carriers is time critical since the operation depends on the timely transportation of the charge carriers to the laterally arranged read-out nodes.

In conventional systems, charge carriers generated inside the photo-conversion region move only by diffusion from the origin of the charge generation to the influence zone of the control electrodes 106a, 106b, 106c. Only at the influence zone of the control electrodes 106a, 106b, 106c the charge carriers are then subjected to an electric field and thereby transferred laterally to the control electrode structure based on the corresponding potential distribution applied to the control electrodes 106a, 106b, 106c. However, in time critical applications such as in a demodulation pixel for a continuous wave (cw) time-of-flight system, this may be a limiting factor since it might take too long for the charge carriers to move from inside the photo-conversion region to the zone of influence by the control electrodes 106a, 106b, 106c. Also, with diffusion as only mechanism for vertical movement, a certain percentage of the charge carriers is lost and does not reach the zone of influence and therefore is lost before reaching the read out nodes. This reduces the effectiveness of the system. Since many time-of flight systems use infrared light which has a higher penetration depth than visible light, the mean distance from the origin of charge generation to the control electrodes 106a, 106b, 106c is even increased.

Embodiments described herein provide for an improved and more efficient controlling of photo-generated charge carriers by generating an electric built-in field for establishing a drift movement.

The electric built-in field may have in some embodiments substantially a vertical field component resulting in a vertical field movement from inside the photo-conversion region towards the plane in which the control electrodes 106a, 106b, 106c are arranged as shown in FIG. 1A. As will be described later on, in some embodiments, the electric built-in field establishes in some parts of the photo-conversion region not only a vertical movement but also a lateral movement. In other words, in some embodiments, the electric built-in field may have in at least some regions of the photo-conversion region lateral field components in addition to vertical field components. In some embodiments, the lateral movement effected by the built-in field effects a concentration of the charge carriers in predefined sections.

In embodiments, the electrical built-in field is a static built-in field generated by providing a non-uniform net doping profile in the photo-conversion region. FIG. 1A shows an exemplary doping profile 122 where a region of specific net doping concentration is shown as one continuous line. The direction of acceleration experienced by the photo-generated electrons in the resulting electric built-in field of the non-uniform doping concentration is shown in FIG. 1A as black bulk arrows. The direction of acceleration experienced by electrons in view of the time-varying control signals applied to the control electrodes 106a, 106b, 106c is shown as grey bulk arrows in FIG. 1A.

It is further to be noted that the electric built-in field is established in the described embodiments by a non-uniform doping profile of only one type of doping (n-doping or p-doping). Thus the built-in-field is different from a built-in field established in bipolar junctions. In particular, it is to be noted that the strength of the electric built-in field is determined by the gradient of the doping concentration. In other words, the more the doping concentration changes per unit length in a direction, the higher the component of the electric built-in field is established in this direction. In some embodiments, the doping concentration in the photo-conversion region continuously changes in the vertical direction, such that an electric built-in field with vertical vector components is established in the photo-conversion region. While the described embodiments use built-in fields established by doping of only one carrier type, it is to be noted that other embodiments may use instead of or in addition thereto electric built-in fields established by bipolar doping profiles.

In some embodiments, the vertical component of the electric built-in field may be constant. The electric built-in field can be calculated according to $E=k_B*T/q_0 \, d\ln(N_a)/dz$, where $k_B$ is the Boltzmann constant, T is the absolute temperature, $q_0$ is the charge of the charge carrier and $d\ln(N_a)/dz$ is the change of the natural logarithm of the doping concentration with increasing distance in vertical direction. Thus, a linear built-in field can be achieved by providing a doping profile in which the logarithm of the doping concentration changes linearly in the vertical direction. In other embodiments, the doping profile may be provided in which the logarithm of the doping concentration is changing super-linearly in vertical direction. Then, a resulting built-in field with a vertical field component which increases in the vertical direction may be obtained. Such embodiments may compensate for the reduced carrier mobility due to the higher doping concentration with increasing depth for example to obtain a constant drift velocity of the charge carriers. The above embodiments may allow a more effective transport of the charge carriers in the vertical direction since charge carriers which are generated farther away from the control electrodes 106a, 106b, 106c are subjected to a stronger acceleration force by the built-in field as compared to charge carriers generated nearer to the control electrodes 106a, 106b, 106c.

In some embodiments, the non-uniform doping profile may extend in the vertical direction from the control electrodes to at least between 3 μm to 50 μm, where each value in this range and each sub-range of this range forms a specific embodiment.

Figure 6:
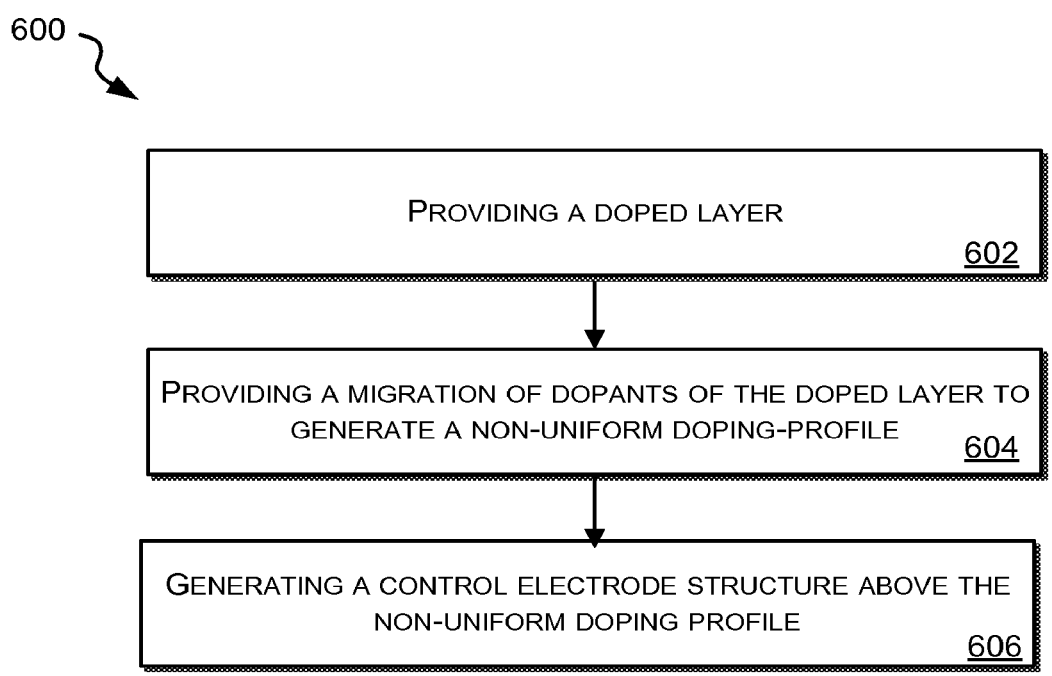
FIG. 6 shows a flow diagram according to an embodiment.

The non-uniform doping profile may in some embodiments be generated by providing a doped layer comprising dopants in a semiconductor layer with an afterward migration of at least a portion of the dopants of the doped layer to at least a region above the doped layer. FIG. 6 shows an example manufacturing flow process 600. At 602, a doped layer is provided wherein at 604 a part of the dopants of the doped layer are migrated afterwards to provide the non-uniform doping profile. The migration step may in some embodiments include a heat treatment. In some embodiments, the doped layer may have a width (full width at half maximum in vertical direction) between 0.1 and 5 μm before the migration step with each value in between and each sub-range forming a specific embodiment. In some embodiments, an activation step may be applied to the doped layer before the migration step. The activation step may include a drive-in anneal to minimize defects. In some embodiments, the non-uniform doping profile may extend in the vertical direction from the control electrodes to at least between 30% and 300% of the width (lateral extension) of the lateral extension of the control electrodes associated with one region to accumulation, where each value in this range and each sub-range of this range forms a specific embodiment.

The portion of the dopants of the doped layer which migrates to the region above the doped layer may in some embodiments be in the range between 1% and 30% of the doping concentration of the doped layer. Finally, at 606 the control electrode structure is generated above the non-uniform doping profile.

Figure 9:
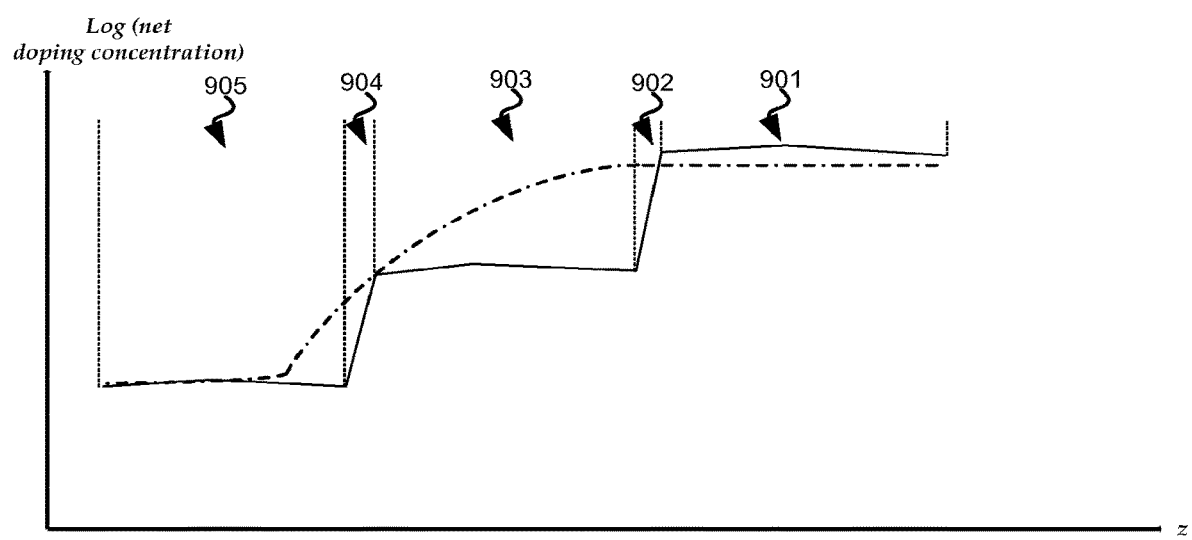
FIG. 9 shows examples of step-wise doping profiles.

The doping profile may be generated in some embodiments by a graded-epi process wherein the doping profile varies gradually during the epitaxial growth of the material forming the photo-conversion region. In some embodiments, a step-wise doping profile may be generated in to provide the build-in field. In some embodiments, a step-wise doping profile may be generated followed by a migration step in which the dopants of the step-wise doping profile are migrate to smooth out the doping steps. Such a migration step may be provided by applying heat. Before the migration step, an activation step may be provided to activate the dopants. The activation step may include for example the application of heat. The step-wise doping profile may include any number of steps such as two steps, three steps etc. The step wise doping profile may include for each step in net doping concentration at least one flat region where the doping profile doesn't change or changes slowly in vertical direction and one steep region where the doping profile change in vertical direction is much higher than in the flat region. FIG. 9 shows an example of a step-wise doping profile 910 before the migration step. In FIG. 9, the ordinate corresponds to the net doping concentration at a logarithmic scale in arbitrary units and the abscissa corresponds to the vertical axis (z-axis). In the doping profile 910 of FIG. 9, a first flat region 901 at high net doping concentration is followed by a first step region 902 which is followed by a second flat region 903 at a doping concentration lower than the first flat region. At the other end, the second flat region 903 is followed by a second steep region 904 which is followed by a third flat region 905 at a net doping concentration lower than the second flat region 903. It is to be understood that FIG. 9 shows only one of many examples for realizing a step-wise doping profile. The flat regions of the step-wise doping profile have a greater extension in vertical direction than the steep regions. In some embodiments, the ratio of the extension in vertical direction of the flat region and steep region is between 3:1 and 10:1. In some embodiments, each of the flat regions may have an extension in the vertical direction between 3 and 8 µm, wherein each value and each subrange forms an embodiment. In some embodiments, each of the steep regions may have an extension in the vertical direction between 0.3 and 1.5 µm wherein each value and each subrange forms an embodiment. After applying the migration step by heating, the step-wise doping profile 910 is transformed into a doping profile 912. The net doping concentration of the doping profile 912 may change in the vertical direction from a first doping concentration which is in the range between $10^{19}$ and $10^{17}$ cm$^{-3}$ to a second net doping concentration which is in the range between $10^{13}$ to $10^{15}$ cm$^{-3}$. The average slope of the doping profile 912 described by the logarithm of the net doping concentration change in cm$^{-3}$ per 1 µm may be in the range between 0.6 and 0.3, wherein each value and each subrange forms an embodiment. It is to be noted that such average slopes may also be achieved by other manufacturing and doping methods. In some embodiments, a step-wise epi-process may be applied in which a first epi layer with a first doping concentration and a second epi layer with a second doping concentration is grown. In some embodiments, the graded-epi process or the step-wise epi process may be combined with a migration step of the dopants allowing a efficient and improved tailoring of the doping profile. In some embodiments, a doped layer may be provided in combination with the graded-epi process or the step-wise epi process to provide additional tailoring of the doping profile.

Figure 2A:
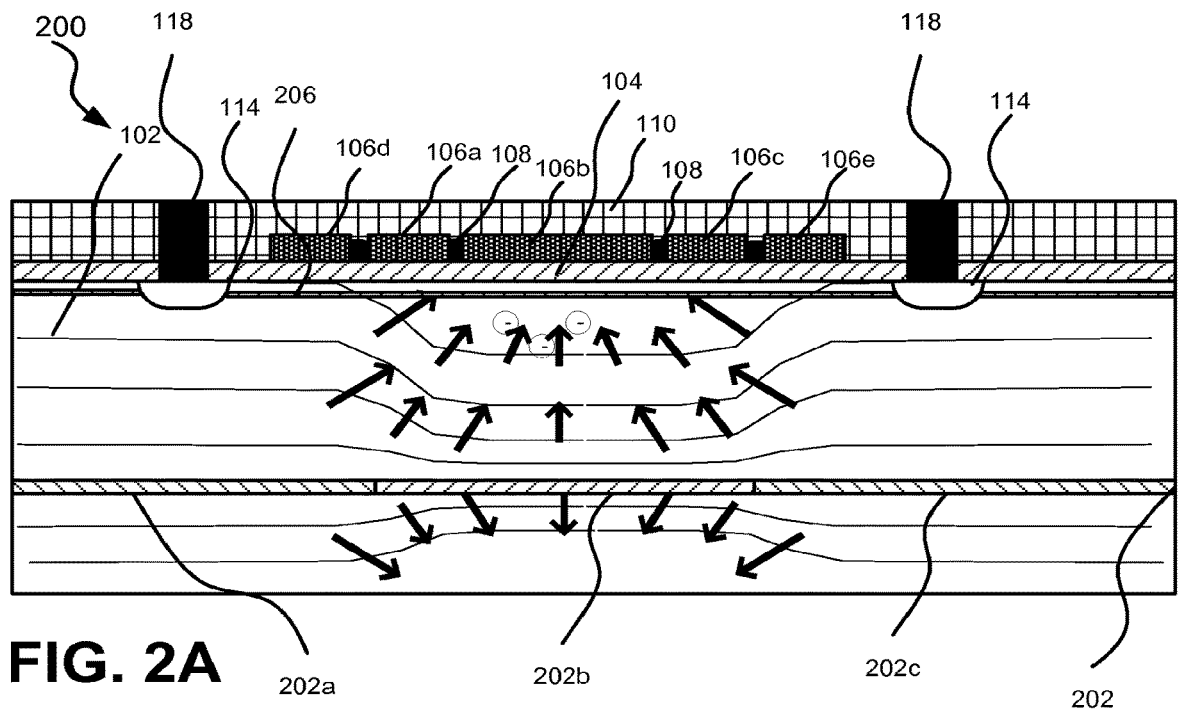
FIG. 2A shows a device according to a further embodiment.

FIG. 2A shows a device 200 including a doping profile with a doped layer. While device 200 includes additional elements not shown in FIG. 1A, it is to be noted that the doping profile explained later on may be also applied to the device structure shown in FIG. 1A as well as to other element configurations and control electrode configurations. In some embodiments, a region to accumulate the photo-generated charge carriers laterally to the control electrodes is provided.

Figure 2B:
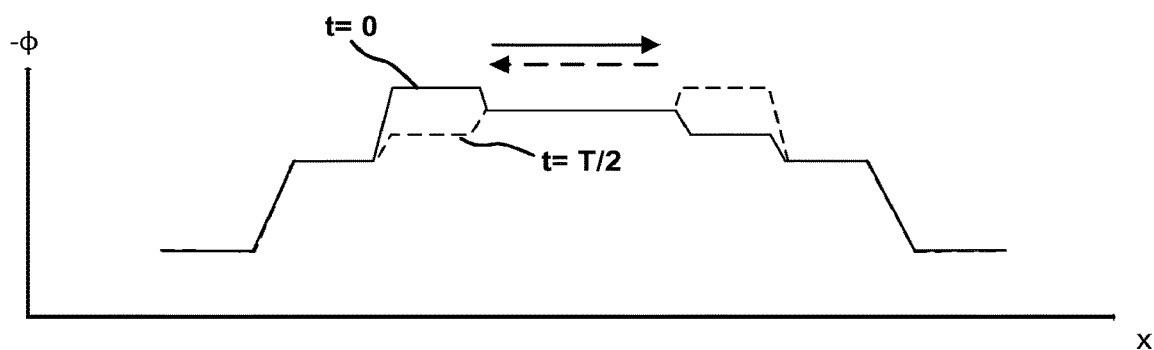
FIG. 2B shows example potential distributions for the device of FIG. 2A.

Distinguished from FIG. 1A, FIG. 2A shows diode structures 114 functioning as read-out nodes lateral to both ends of the electrode structure. The diode structures 114 function to accumulate charge carriers and may be formed for example by a doped well within the substrate. The control electrode structure is arranged between both diode structures 114. The diode structures 114 are electrically connected by connecting structures 118 for providing output signals to further processing. In addition to the control electrodes 106a, 106b and 106c, additional separation electrodes 106d and 106e held at a constant electric potential are provided between the diode structures 114 and the control electrodes 106a, 106b, 106c. The separation electrodes 106d and 106e function to limit influences of the control electrodes 106a, 106b, 106c such as a signal coupling to the diode structures 114. Furthermore, a buried channel 206 is provided to enhance the lateral transport of the charge carrier under the influence of the control electrodes 106a, 106b, 106c. Similar to FIG. 1B, FIG. 2B shows for an example operation the corresponding potential distributions generated by the control electrodes 106a, 106b, 106c and the separation electrodes 106d and 106e.

Distinguished from FIG. 1A, the electric built-in field established by the doping profile according to FIG. 2A has in some regions of the photo-conversion region not only a vertical field component but also a lateral field component. The doping profile has a lateral variation of the net doping concentration substantially symmetric with respect to a plane through the centre of the control electrode structure as shown in FIG. 2A. The mirror symmetry establishes in addition to the vertical movement also a lateral movement to concentrate the charge carriers in a predefined section of the pixel which may for example be the section of highest transfer efficiency of the control electrodes 106a, 106b, 106c.

To achieve the lateral field components, the photo-conversion region comprises in the embodiment of FIG. 2A a doped layer 202 having a lateral variation of the net doping concentration. In the embodiment of FIG. 2A, the doped layer 202 is segmented in a first section 202a, a second section 202b and a third section 202c. The doped layer 202 may for example be a provided as a buried layer provided within a manufacturing process.

The first and third section 202a, 202c surrounding the second section 202b are doped to a higher net-doping concentration than the second section 202b. In some embodiments, the first and third sections 202a, 202c may have substantially the same net doping concentration. The non-uniform doping profile provided in the embodiment of FIG. 2A may be generated by a migration of dopants of the doped layer 202 as explained above with respect to FIG. 6.

It can further be observed from FIG. 2A that a local maximum in the vertical direction of the net doping concentration is provided by the doped layer 202 in the photo-conversion region. In other words, the net doping concentration decreases when moving from the doped layer 202 in the vertical direction towards the control electrodes 106a, 106b, 106c as well as when moving from the doped layer 202 in the vertical direction away from the control electrodes 106a, 106b, 106c. This results in the vertical component being reversed above and below the doped layer 202. With such a doping profile, a depth-selective transport of the photo-generated charge carriers can be provided. It allows discarding photo-generated charge carriers generated deep in the substrate which would not be timely transported to the influence zone of the control electrodes 106a, 106b, 106c by providing a transport where such photo-generated charge carriers are moved away from the control electrodes 106a, 106b, 106c. Thus, the contrast can be further improved by providing such a depth selective transport mechanism.

Similar to FIG. 1A, the black bulk arrows in FIG. 2A show the acceleration vector field corresponding to the electric built-in field. It can be observed that the established built-in field provides the concentration effect in view of the mirror symmetry as well as the depth-selective effect causing photo-generated electrons which are generated below the doped layer 202 to be directed away from the control electrode structure.

It is to be realized that many variants of tailoring the electric built-in field are possible. In some embodiments, the lateral variation of the net doping concentration in the doped layer includes at least a variation of at least 30% of the maximum net doping concentration of the doped layer. While FIG. 2A shows a lateral variation of the doping concentration by providing three sections, it is to be understood that other lateral variations can be implemented including a doped layer with more than three sections of different doping concentrations or a continuous variation of the doping concentration of the doped layer.

The non-uniform doping profile may have a net doping concentration which increases with increasing depth along a vertical direction from a first net doping concentration in the range between $10^{12}$ cm$^{-3}$ and $10^{15}$ cm$^{-3}$ to a second net doping concentration in the range between $1.1 \times 10^{15}$ cm$^{-3}$ and $10^{20}$ cm$^{-3}$, with every value in each range and every sub-range in each range forming an embodiment.

In some embodiments, the section of the doped layer 202 with the lowest net doping concentration may be below a central section of the control electrode structure as shown in FIG. 2A. In some embodiments, the central section of the control electrode structure may be the in the middle between the two lateral read-out nodes. This provides the concentration effect at the central section of the control electrode structure where modulation efficiency for the charge carriers is highest. It is however to be noticed that many variations of the non-uniform doping profile may be provided including non-symmetrical doping-profiles.

Figure 3:
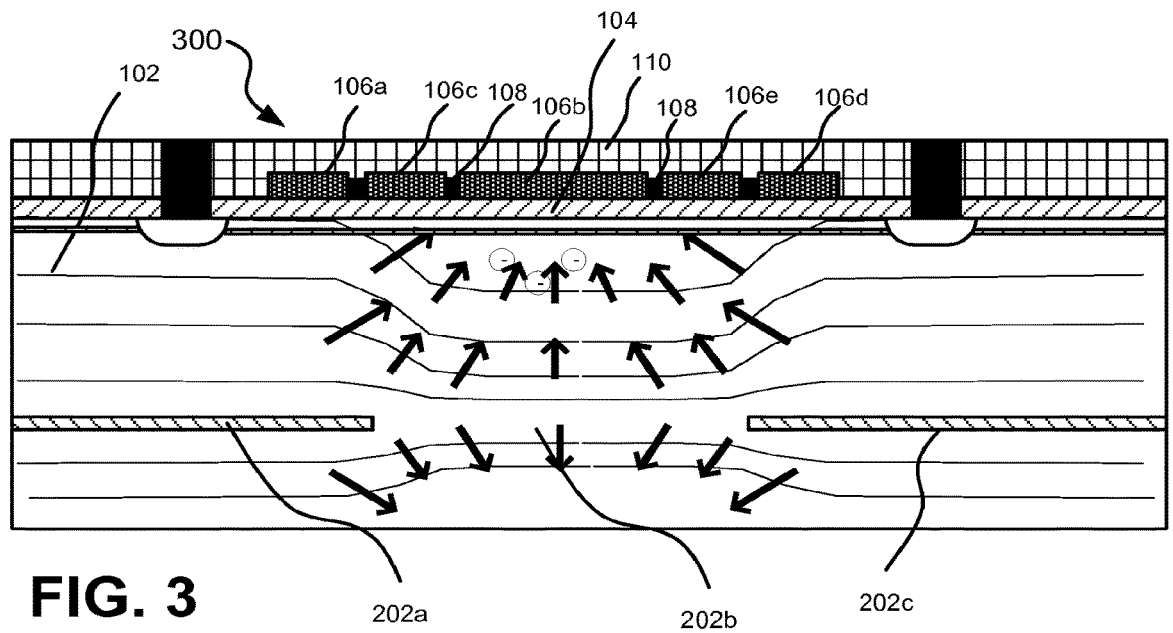
FIG. 3 shows a device according to a further embodiment.

In some embodiments, the doped layer 202 may have the lower doped section 202b at substantially the same net doping concentration as the substrate 102 before the migration of dopants is effected as explained with respect to FIG. 6. FIG. 3 shows an embodiment of a device 300 having a doping concentration as explained above. The structures of the device 300 basically correspond to the structures explained with respect to FIG. 2A. It can be observed from FIG. 3 that a part of the dopants from the section 202a and section 202c have migrated to the central section 202b to form the doping profile in the section 202b as well as in other parts of the photo-conversion region.

In some embodiments, a further doped layer may be provided in the substrate at a depth (distance in z-direction from the surface at which the control gates are arranged) different than a depth of the other doped layer.

Figure 4:
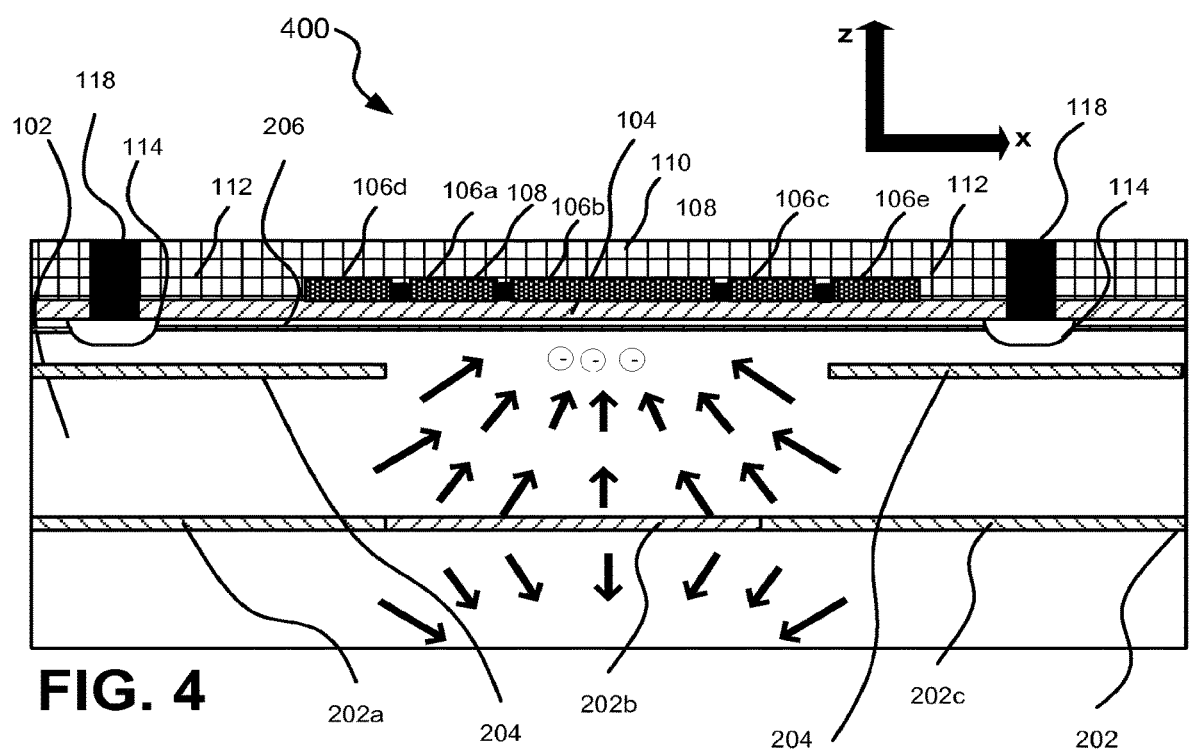
FIG. 4 shows a device according to a further embodiment.

FIG. 4 shows an embodiment of a device 400 similar to FIG. 2A including a further doped layer 204. The further doped layer 204 may extend in embodiments in a lateral direction at least beyond a predefined region to which the photo-generated charge carriers are directed by the control electrodes 106a, 106b, and 106c. In other words, in embodiments, the further doped layer may extend at least under and beyond the diode structure 114 to which the photo-generated electrons are directed by the control electrodes 106a, 106b, and 106c. As can be seen in FIG. 4, the doped layer 204 provides in addition to an increased concentration effect also a shielding effect for the diode structure 114 such that photo-generated electrons are not allowed to directly move from inside the photo-conversion to the diode structure 114 but only by the influence of the electric fields established by the control electrodes 106a, 106b, 106c.

Figure 5:
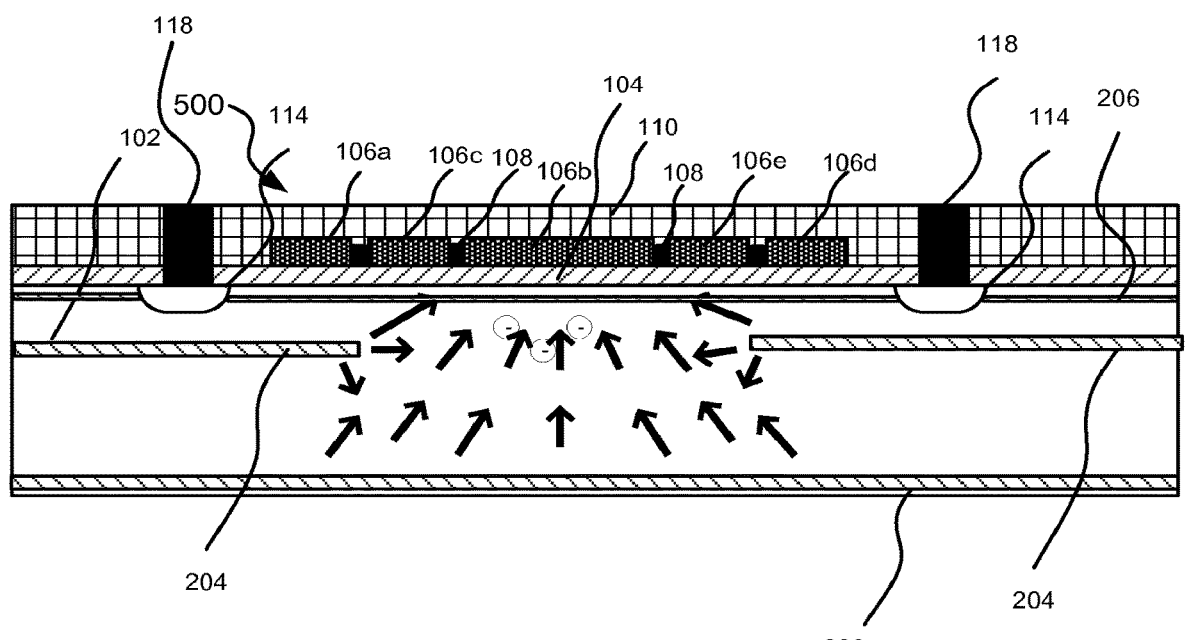
FIG. 5 shows a device according to a further embodiment.

In some embodiments, the doped layer 202 may be provided at or proximate the backside of the substrate 102 as shown in FIG. 5. The doped layer 202 provided at or proximate the backside may be provided with a lateral net doping variation for example by having different sections with different net doping concentrations as explained above. In some embodiments, the doped layer 202 may have no lateral doping variation, i.e. the net doping concentration may be constant through the doped layer 202. It is to be noted that the embodiment of FIG. 5 allows having a backside illumination instead of a front side. In other words, the light may penetrate from the backside of the substrate 102 into the photo-conversion region. A thinning process may be used in embodiments in order to provide the substrate with a thickness in a range between 20 μm and 100 μm, where each value of the range and each sub-range forms a specific embodiment.

Applications of the devices explained above may include photon-mixing applications in order to provide demodulation in time-of-flight systems where the control electrode structure is configured to receive an electric signal which is linked in a time relationship (e.g. phase delay) to the modulation signal.

Figure 8:
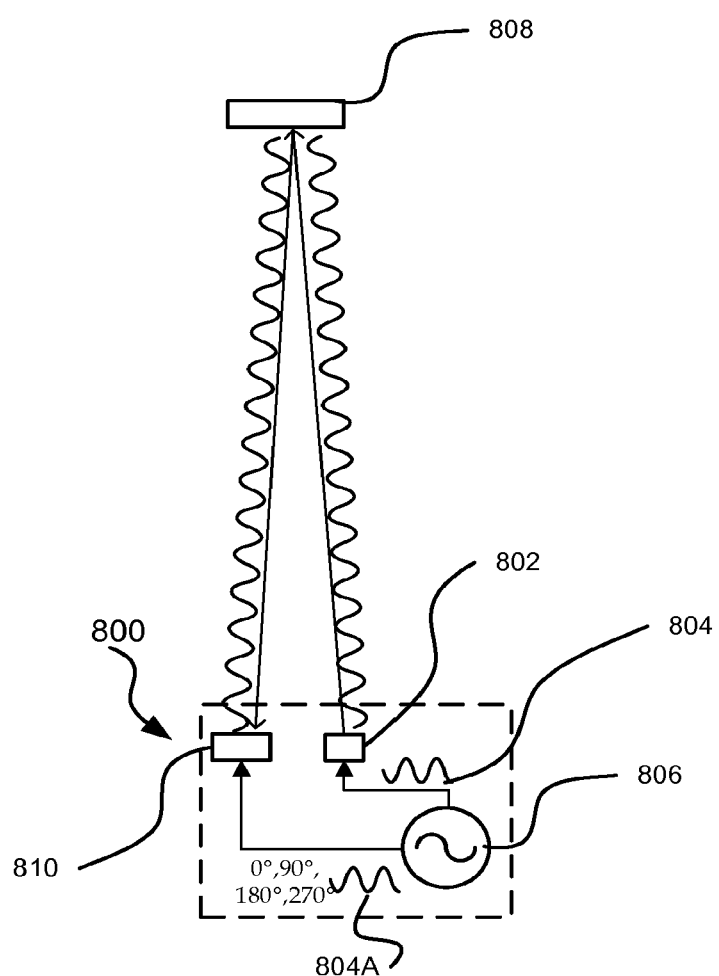
FIG. 8 shows a time-of-flight system application according to an embodiment.

FIG. 8 shows an embodiment of a device 800 where light generated by a light source 802 is continuously amplitude modulated based on a modulation signal 804 generated by a signal source 806. The modulation signal may include a sine waveform but other signal waveforms such as rectangular or triangular waveforms may be used as well. The modulated light signal is provided to determine the distance to an object 808. The modulated light reflected by the object 808 is directed to an imager device 810 which includes pixels as shown for example in the embodiments described with respect to FIGS. 1A, 2A, 3, 4 and 5. In the imager device 810, a signal 804A which corresponds to the modulation signal 804 phase shifted by a predetermined phase, e.g. 0°, 90°, 180° and 270°, is provided to the control electrodes for mixing and demodulation of the reflected light within each pixel. Certain time intervals are assigned for each of the predetermined phases. After integrating the signals in the respective time intervals for each phase 0°, 90°, 180° and 270°, output signals I0, I1, I2, I3 are obtained corresponding to each phase. From the output signals I0, I1, I2, I3, the phase information corresponding to the time to travel can be computed as is known to a person skilled in the art. It is to be noted that the structure of FIG. 2A having two read-out nodes at both sides allows to simultaneously obtain the phases I0 and I2 and the phases i1 and I3, respectively.

In a further processing of the output signals, information corresponding to the distance of the object 808 is provided to a user. In the embodiment shown in FIG. 8, the signal 804A is provided in time intervals phase shifted with respect to the modulation signal 804. It is to be understood that only the relative phase shift of the modulation signal and the demodulation signal is required. Therefore, in other embodiments a system with interchanged signals 804 and 804A may be provided in which the modulation signal 804 for the light modulation is phase shifted in different time intervals with respect to the signal 804A which is provided with no phase change.

While the embodiment described includes 4-phase calculations, it is to be noted that other calculations using 3 phase delays or 5 or more phase delays may be utilized in other embodiments.

Figure 7:
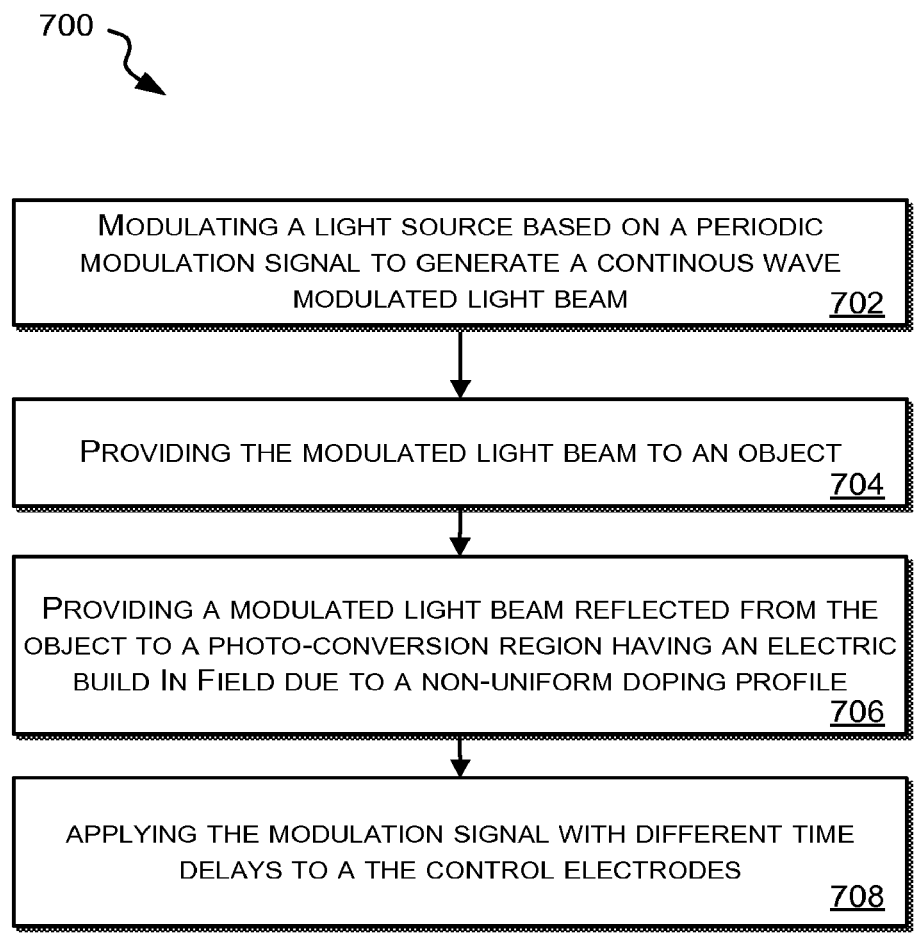
FIG. 7 shows a flow diagram according to an embodiment.

Referring now to FIG. 7, a flow diagram of an example light demodulation when using the device 800 will be described. In a first step 702, the light source is modulated based on a periodic modulation signal to generate a continuous wave light beam. At 704, the modulated light beam is provided to an object. At 706, the modulated light beam which is reflected from the object is provided to a photo-conversion region having an electric built-in field caused by a non-uniform doping profile as explained above. At 708, a time varying potential distributions are generated by the control electrodes based on an application of signals.

It is to be noted that the application in a continous time-of-flight system is only of example character and many other application of the concept described herein may be utilized for example in time-of-flight systems based on light pulses etc.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure.

This Detailed Description, therefore, is not to be taken in a limiting sense, and the scope of various embodiments is defined only by the appended claims, along with the full range of equivalents to which such claims are entitled.

Such embodiments of the inventive subject matter are described herein without intending to voluntarily limit the scope of this application to any single embodiment or concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a very broad sense. For example, the terms "circuit" or "circuitry" used herein are to be interpreted in a sense not only including hardware but also software, firmware or any combinations thereof. The term "data" may be interpreted to include any form of representation such as an analog signal representation, a digital signal representation, a modulation onto carrier signals etc. The term "information" may in addition to any form of digital information also include other forms of representing information. The term "entity" or "unit" may in embodiments include any device, apparatus circuits, hardware, software, firmware, chips or other semiconductors as well as logical units or physical implementations of protocol layers etc. Furthermore, it may be noticed that a device or apparatus may include separate parts such as multiple chips, multiple logical units etc. Furthermore the terms "coupled" or "connected" may be interpreted in a broad sense not only covering direct but also indirect coupling.

It is further to be noted that embodiments described in combination with specific entities may in addition to an implementation in these entity also include one or more implementations in one or more sub-entities or sub-divisions of said described entity. For example, specific embodiments described herein to be implemented in a TOF imager device may be implemented in other imager devices or other devices with a need for a fast and efficient collection of carriers in a predefined area.

The accompanying drawings that form a part hereof show by way of illustration, and not of limitation, specific embodiments in which the subject matter may be practiced.

In the foregoing Detailed Description, it can be seen that various features are grouped together in a single embodiment for the purpose of streamlining the disclosure. This method of disclosure is not to be interpreted as reflecting an intention that the claimed embodiments require more features than arc expressly recited in each claim. Rather, as the following claims reflect, inventive subject matter lies in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple sub steps. Such sub steps may be included and part of the disclosure of this single step unless explicitly excluded.

What is claimed is:

1. A device, comprising:
    a semiconductor substrate comprising:
        a photo-conversion region to convert light into photo-generated charge carriers, the photo-conversion region having:
            a doped layer that causes a net doping concentration to vary in a lateral direction and a vertical direction such that the photo-conversion region has a non-uniform doping profile,
                the doped layer being a single layer comprising a first section, a second section horizontally adjacent to the first section, and a third section horizontally adjacent to the second section,
                    the first section and the third section being doped to a higher net doping concentration than the second section,
                the non-uniform doping profile causing the photo-generated charge carriers to be directed in the lateral direction toward a predefined section of a control electrode structure with respect to the lateral direction,
                the non-uniform doping profile causing a first set of the photo-generated charge carriers to be directed from the doped layer in a first vertical direction towards the control electrode structure, and
                the non-uniform doping profile causing a second set of the photo-generated charge carriers to be directed from the doped layer in a second vertical direction away from the control electrode structure,
            a first region to accumulate the first set of the photo-generated charge carriers, and
            a second region to accumulate the second set of the photo-generated charge carriers,
                the second region having a net doping concentration that decreases from the doped layer in the second vertical direction away from the control electrode structure; and
        the control electrode structure including a plurality of control electrodes to generate a potential distribution such that the photo-generated charge carriers are guided towards the first region to accumulate the first set of the photo-generated charge carriers or the second region to accumulate the second set of the photo-generated charge carriers based on signals applied to the control electrode structure.

2. The device of claim 1, wherein the predefined section of the control electrode structure is at a center of the control electrode structure in the lateral direction.

3. The device of claim 1, wherein the net doping concentration is substantially symmetric with respect to a plane through a center of the control electrode structure.

4. The device of claim 1, wherein the predefined section of the control electrode structure is a section of highest transfer efficiency of the control electrode structure.

5. The device of claim 1, wherein a net doping concentration of the first section is substantially a same net doping concentration as a net doping concentration of the third section.

6. The device of claim 1, wherein a net doping concentration of the doped layer includes a variation of at least 30% of a maximum net doping concentration of the doped layer.

7. The device of claim 1, wherein a doping concentration of the doped layer continuously varies along the lateral direction.

8. The device of claim 1, wherein the doped layer that causes the net doping concentration to vary in the first vertical direction and the second vertical direction.

9. The device of claim 1, further comprising:
    a buried channel configured to enhance lateral transport of the photo-generated charge carriers.

10. The device of claim 1, wherein the second section is arranged below the predefined section of the control electrode structure.

11. The device of claim 1, wherein the predefined section of the control electrode structure is arranged between two read-out nodes.

12. A device, comprising:
    a substrate comprising a first main surface and a second main surface,
        the substrate further comprising:
            a photo-conversion region to convert incoming light into photo-generated charge carriers, and the device being configured to receive the incoming light at the second main surface,
                the photo-conversion region having:
                    a doped layer that causes a net doping concentration to vary in a lateral direction such that the photo-conversion region has a non-uniform doping profile,
                        the doped layer being a single layer comprising a first section, a second section horizontally adjacent to the first section, and a third section horizontally adjacent to the second section,
                            the first section and the third section being doped to a higher net doping concentration than the second section,
                        the non-uniform doping profile causing the photo-generated charge carriers to be directed in the lateral direction toward a predefined section of a control electrode structure with respect to the lateral direction,
                        the non-uniform doping profile causing a first set of the photo-generated charge carriers to be directed from the doped layer in a first vertical direction towards the control electrode structure, and
                        the non-uniform doping profile causing a second set of the photo-generated charge carriers to be directed from the doped layer in a second vertical direction away from the control electrode structure,
                    a first region to accumulate the first set of the photo-generated charge carriers, and
                    a second region to accumulate the second set of the photo-generated charge carriers,
                        the second region having a net doping concentration that decreases from the doped layer in the second vertical direction away from the control electrode structure; and
            the control electrode structure, arranged at the first main surface, to generate a potential distribution in the substrate such that the photo-generated charge carriers are guided towards the first region or the second region based on signals applied to the control electrode structure.

13. The device of claim 12, wherein the predefined section of the control electrode structure is at a center of the control electrode structure in the lateral direction.

14. The device of claim 12, wherein the net doping concentration is substantially symmetric with respect to a plane through a center of the control electrode structure.

15. The device of claim 12, wherein the predefined section of the control electrode structure is a section of highest transfer efficiency of the control electrode structure.

16. The device of claim 12, wherein a net doping concentration of the first section is substantially a same net doping concentration as a net doping concentration of the third section.

17. The device of claim 12, wherein a net doping concentration of the doped layer includes a variation of at least 30% of a maximum net doping concentration of the doped layer.

18. The device of claim 12, wherein a doping concentration of the doped layer continuously varies along the lateral direction.

19. The device of claim 12, further comprising:
a buried channel configured to enhance lateral transport of the photo-generated charge carriers.

20. A device, comprising:
a substrate including:
a photo-conversion region to convert incoming light into photo-generated charge carriers,
the photo-conversion region having:
a doped layer that causes a net doping concentration to vary in a lateral direction such that the photo-conversion region has a non-uniform doping profile,
the doped layer being a single layer comprising a first section, a second section, and a third section,
the first section and the third section being doped to a higher net doping concentration than the second section,
the non-uniform doping profile causing the photo-generated charge carriers to be directed in the lateral direction toward a predefined section of a control electrode structure with respect to the lateral direction,
the non-uniform doping profile causing a first set of the photo-generated charge carriers to be directed from the doped layer in a first vertical direction towards the control electrode structure, and
the non-uniform doping profile causing a second set of the photo-generated charge carriers to be directed from the doped layer in a second vertical direction away from the control electrode structure,
a first accumulation region to accumulate the first set of the photo-generated charge carriers, and
a second accumulation region to accumulate the second set of the photo-generated charge carriers,
the second accumulation region having a net doping concentration that decreases from the doped layer in the second
vertical direction away from the control electrode structure; and
the control electrode structure to generate a potential distribution, the potential distribution to be generated such that the photo-generated charge carriers are guided towards the first accumulation region or the second accumulation region based on a signal applied to the control electrode structure.

* * * * *